United States Patent [19]

Erisman

[11] Patent Number: 5,499,176
[45] Date of Patent: Mar. 12, 1996

[54] PULSE TRANSFORMER CIRCUIT FOR ISOLATING ELECTRICAL SIGNALS

[75] Inventor: Brian P. Erisman, Colorado Springs, Colo.

[73] Assignee: Toko America, Inc., Mount Prospect, Ill.

[21] Appl. No.: 105,390

[22] Filed: Aug. 12, 1993

[51] Int. Cl.$^6$ ................................................ H02M 3/335
[52] U.S. Cl. ............................ 363/21; 363/64; 323/902
[58] Field of Search ................................ 363/21, 64, 97, 363/131; 323/902

[56] References Cited

U.S. PATENT DOCUMENTS

| 4,862,339 | 8/1989 | Inou et al. | 363/21 |
| 4,885,673 | 12/1989 | Philippe | 363/21 |
| 4,926,303 | 5/1990 | Sturgeon | 363/21 |

Primary Examiner—Peter S. Wong
Attorney, Agent, or Firm—William E. Hein

[57] ABSTRACT

A signal isolator circuit employing a pulse transformer overcomes the disadvantages of both prior art opto-coupler and pulse transformer signal isolator circuits by employing an active signal retrieval circuit which, in a higher accuracy configuration, repetitively performs the following steps on the electrical side of the pulse transformer where the signal information is required: 1) drives a current pulse into the pulse transformer; 2) samples or detects the voltage across the pulse transformer after it has been stabilized; 3) holds or stores the sampled voltage for a full cycle of operation; and, if necessary, 4) filters the sampled signal. On the other electrical side of the pulse transformer, the retrieval circuitry is configured such that when the pulse transformer is being driven by the current pulse, the voltage will be clamped by the source signal reset. In a lower accuracy configuration, the signal retrieval circuit of the present invention performs the same steps set forth above with the exception that, rather than sampling the voltage across the pulse transformer, the reflected impedance is detected as being either high or low, by some quantitative measure, and the detector output will be set to either a high or low voltage corresponding to the detected impedance.

4 Claims, 2 Drawing Sheets

PULSE TRANSFORMER CIRCUIT FOR ISOLATING ELECTRICAL SIGNALS

BACKGROUND AND SUMMARY OF THE INVENTION

This invention relates generally to circuits for isolating various electrical signals and more particularly to an improved isolation circuit employing a pulse transformer.

Various applications in the electronics industry require isolation of an electrical signal. One such application, for example, is that of off-line power supplies. In such power supplies, it is necessary to convey information about the status of the output voltage to a power controller. This information is commonly known as an error voltage signal or simply an error signal. More generally, this signal may be characterized as an analog signal. In many power supplies, it is required that the output voltage be electrically isolated from the source of power. If this requirement exists and, if, as is often the case, the power controller is electrically connected to the source of power, then it is necessary that the error signal be conveyed across an electrical isolation boundary. In such a process, the signal to be conveyed across the isolation boundary is known as the source signal, and the reconstructed conveyed signal is known as the target signal.

Two popular methods for conveying an analog signal across an electrical isolation boundary are known in the prior art. One such method is by optical conveyance using an optical isolator, also called an opto-coupler. Another such method is by magnetic conveyance using a transformer, which serves in the more specific capacity in such an application as a pulse transformer. Prior art power supplies which use primary-side controllers typically employ one of these two methods to isolate the error signal.

An opto-coupler is commonly employed in that application because it is easily understood, it does not require a clocking signal, and it is easily configured with a single three-pin TL431 integrated circuit in combination with several passive components to perform the error signal isolation. There are some limitations in using an opto-coupler in such an application. These limitations include, but are not limited to, the following:

1) the initial and long term gain stability of the opto-coupler degrade the capability for the closed-loop response of the power supply to be optimized;

2) the isolation voltage is limited by the structure of the opto-coupler;

3) the isolation capacitance of the opto-coupler can be problematic in applications sensitive to AC isolation (e.g. medical equipment); and 4) the simplest configuration of an opto-coupler with a TL431 device produces a unity-gain zero in the error amplifier which complicates optimization of the closed-loop response of the power supply.

A pulse transformer may alternatively be employed in that application. It, too, has limitations inherent in the prior art means of implementation. These include, but are not limited to, the following:

1) it requires more complex supporting circuitry than the opto-coupler technique;

2) it requires a clocking signal on the electrical side in common with the source signal;

3) it can introduce spectral interference into the power supply system if the pulses driving the pulse transformer are not synchronized with the switching of the power transformer of the power supply; and 4) the simplest means for recovering the amplitude information of the isolated signal (i.e. by single-ended rectification) has a non-linear performance which is difficult to characterize.

Both of the prior art means of electrically isolating a signal have one common and more fundamental limitation. The limitation is inherent in what can be described as a send and receive process employed by both means. The action of transmitting or sending the signal is performed by the portion of circuitry which is electrically isolated from the portion of circuitry which receives the signal to perform its function. The portion of circuitry which receives the signal requires a source of voltage to perform its function. The portion of the circuitry which sends the signal also requires a source of voltage to accomplish the transmitting process. Thus, in the aforementioned example of a power supply, the portion of circuitry electrically connected to the output of the power supply, commonly known as the secondary side, requires a source of voltage in order to transmit the error signal to the primary-side controller. Often, the output voltage of a power supply is used to power the sending circuitry. When the output voltage is not fully established, such as when the supply is initially turned on or when it is overloaded, there may be an insufficient source of voltage to accomplish the transmitting process. This leaves the options that either the power supply must provide a supplemental isolated source of voltage to power the sending circuitry on the secondary side or the primary-side controller circuitry must operate apart from having the error signal information or any other information about the output side of the power supply other than that which may be derived through its main power transformer. The former option is often not economically feasible and the latter option disallows a well-controlled current fold-back characteristic.

It is therefore a principal object of the present invention to provide a signal isolator circuit that overcomes the limitations set forth in the preceding paragraphs, but which nevertheless employs a pulse transformer in order to eliminate the disadvantages of prior art opto-couplers.

This and other objects are accomplished in accordance with the illustrated preferred embodiment of the present invention by employing a retrieval process, as opposed to the prior art pulse transformer and opto-coupler designs which employ a send and receive process.

In summary, the retrieval process of the present invention is accomplished in a higher accuracy configuration by repetitively, in synchronization with a clocking signal, performing the following steps on the electrical side of the pulse transformer where the target signal must be derived:

1) drive a current pulse into the pulse transformer;

2) sample (detect) the voltage across the pulse transformer after it has stabilized but while the current pulse is still active;

3) hold (store) the sampled voltage for a full clock cycle; and, if necessary, 4) filter the sampled voltage signal.

On the other electrical side of the pulse transformer, where the source signal has its origin, the retrieval circuitry is configured such that when the pulse transformer is being driven by the current pulse, the voltage will be clamped by the source signal.

Furthermore, both electrical side of the pulse transformer must be configured to allow a reversal of the voltage polarity. Either side of the pulse transformer must also be configured to provide a reset path for the magnetizing current.

It should be noted that the sampling and holding requirement may also be accomplished by passive means, rather than active means required by sample-and-hold circuitry, by using a peak detection circuit consisting of some rectification means and a capacitor for holding the voltage of the recovered target signal. This will create a further bandwidth limitation and will also exhibit the non-linearities associated with the simplest means of recovering amplitude information in the prior art pulse transformer signal isolator circuit.

In a lower accuracy configuration, the retrieval process of the present invention involves the same steps as set forth above with the exception that, rather than holding the sampled voltage across the pulse transformer, the reflected impedance is detected as being either high or low, by some quantitative measure, attainable from the sampled voltage, and the detector output will be set to either a high or low voltage, corresponding to the detected impedance. This simpler configuration is sufficient to accomplish the isolation of digital signals, since precise analog information is not needed.

Since the retrieval process is initiated and powered by circuitry on the target signal side of the electrical isolation boundary, the limitations associated with the prior art pulse transformer means of electrically isolating signals are overcome as follows:

1) the retrieval circuitry is not particularly complex;

2) the clocking signal can be shared with the primary-side controller since the clocking is required only on the target signal side;

3) spectral interference is inherently eliminated by virtue of synchronization of the retriever circuit with the primary-side controller; and 4) the sample-and-hold circuitry eliminates non-linear performance characteristics.

A further advantage is realized in that the portion of the retriever circuitry which is electrically connected to the primary-side of the pulse transformer can be integrated into a primary-side control integrated circuit with the addition of only a single pin.

DETAILED DESCRIPTION OF THE PREFERRED EMBODIMENT

Figure 1:
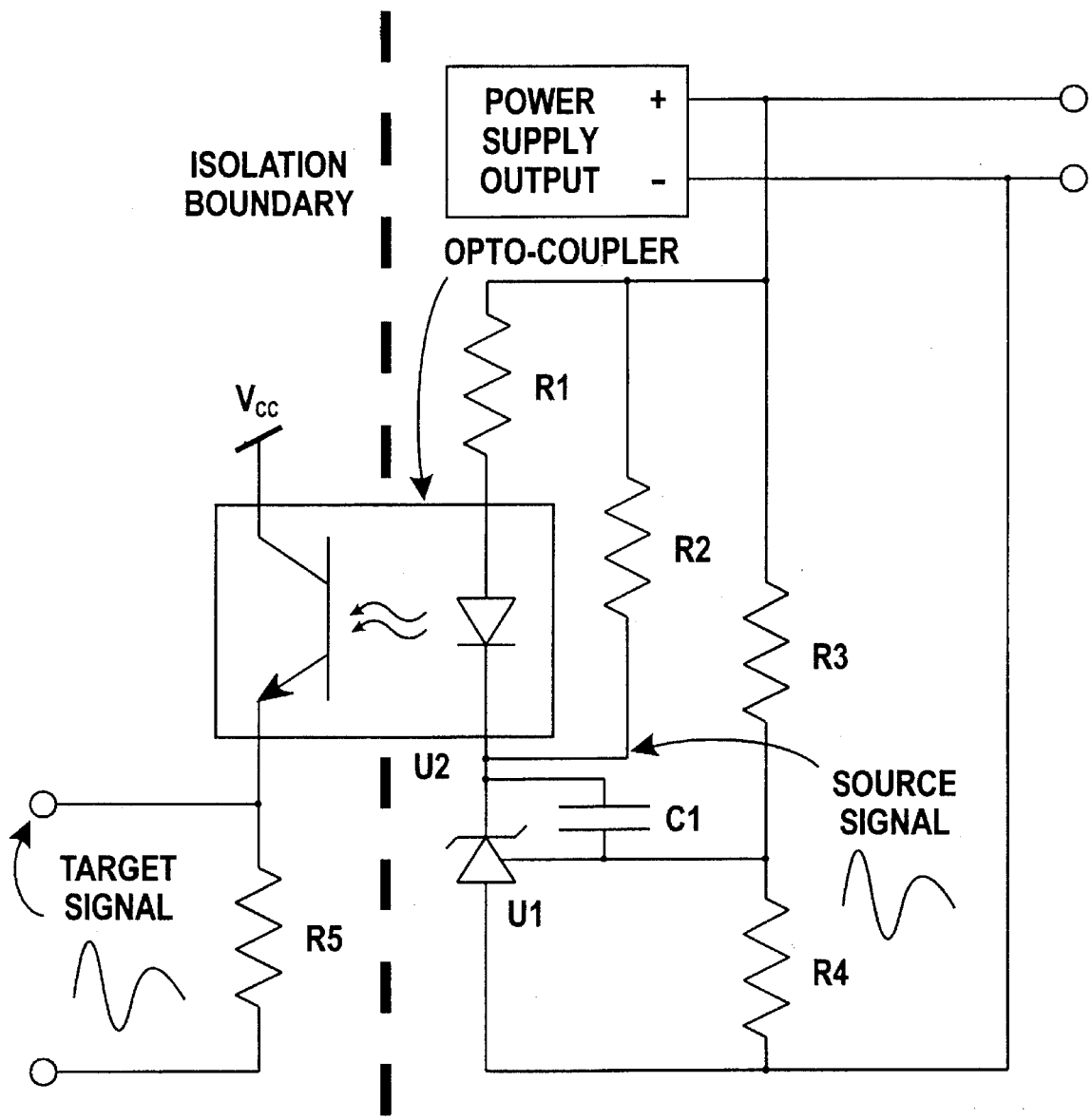
FIG. 1 is a schematic diagram of a prior art signal isolation circuit employing an opto-coupler.
Figure 2:
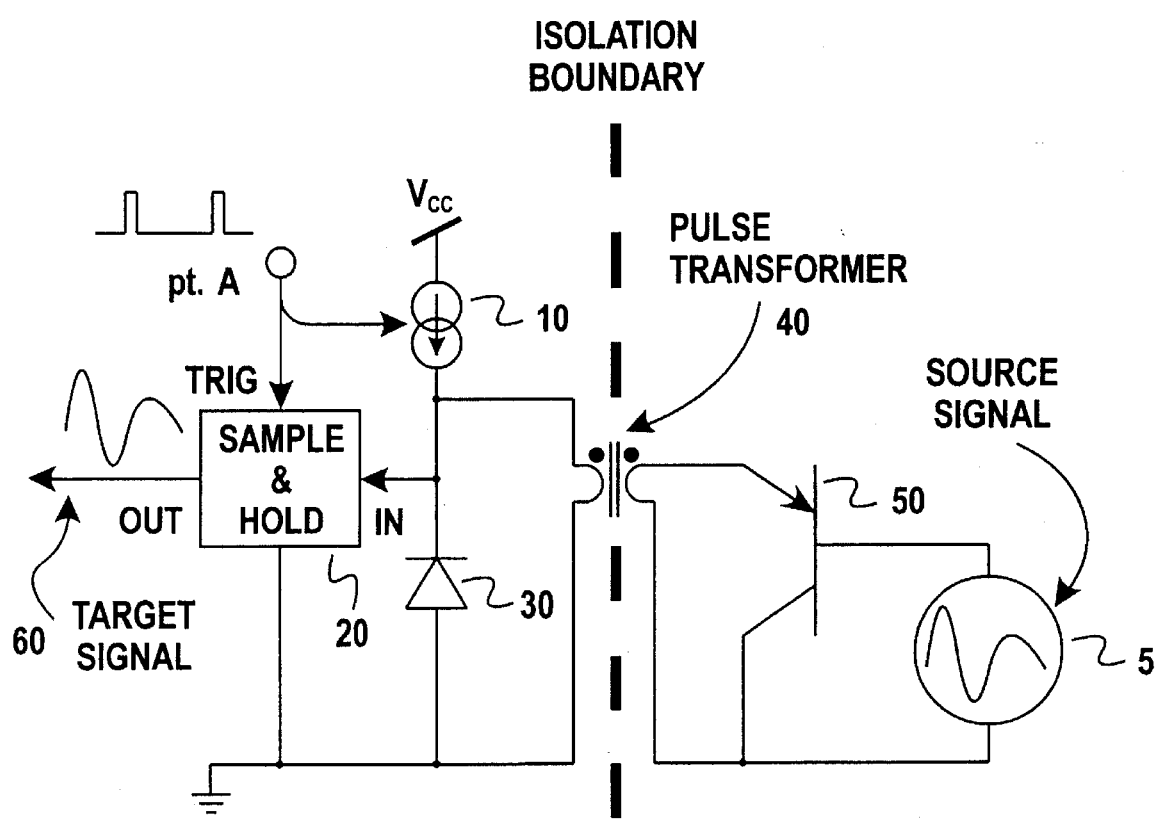
FIG. 2 is a schematic diagram of a signal isolation circuit employing a pulse transformer in accordance with the teachings of the present invention.

Referring now to FIG. 2, there is shown a circuit diagram of a signal isolation circuit that performs the steps of the higher accuracy retrieval process summarized above to isolate and reproduce a source signal 5. The waveform appearing at terminal A is a representation of voltage vs. time at that terminal. When the waveform voltage is in a high state, a current source 10 and the sampling action of a sample and hold circuit 20 are activated. A diode 30 is employed to clamp the voltage across the primary winding of a pulse transformer 40 and to provide a current path to allow pulse transformer 40 to reset when current source 10 is turned off. The target signal 60, which appears at the output of sample and hold circuit 20, is a reconstruction of source signal 5, isolated and retrieved. A PNP transistor 50 serves as both a buffer and a rectifier. When current source 10 is activated, the voltages across both windings of the pulse transformer 40 rise rapidly. When that voltage reaches the level which forward biases the emitter-base junction of PNP transistor 50, the voltage is clamped by transistor 50. Since the voltage at the base of transistor 50 is driven by source signal 5, the voltage across pulse transformer 40 is then equal to the voltage of source signal 5 plus the forward bias voltage of the emitter-base junction of transistor 50. The voltage sampled by sample and hold circuit 20 is then equal to the voltage of source signal 5 plus the forward bias voltage. This forward bias voltage of transistor 50 will approximately have a fixed value which may be either accounted for by estimation or neglected if the static value of the source signal 50 is not of interest.

The isolation circuit of the present invention offers some advantages inherent in the retrieval process described in detail above, besides allowing the use of a pulse transformer without the disadvantages previously associated therewith, and besides eliminating an opto-coupler and the disadvantages associated therewith. The retrieval process does not require circuitry on the source signal side of pulse transformer 40 to be powered in order to retrieve information. Thus, even if the error amplifier circuitry which normally produces the source signal 5 has insufficient voltage to operate properly, the retriever circuit may still be able to determine sufficient information about the state of the power supply in order to provide a better controlled behavior. Using the TL431 configured as an error amplifier in a manner similar to that previously associated with the opto-coupler isolation technique, and yet without having a supplemental isolated voltage source to power the error amplifier and other peripheral circuitry on the output side, it is possible to provide a power supply with all of the following characteristics:

1) a current foldback feature which works even when the output voltage is short circuited;

2) the ability to shut down the power supply using a secondary-side control signal that requires practically no power at all; and 3) the ability to have current sharing between two or more supplies by single-wire secondary-side interconnection only.

In summary, the present invention facilitates implementation of the foregoing three features in a power supply which offers the economical advantage of primary-side control without a supplemental isolated voltage source for the secondary side.

I claim:

1. A process for retrieving, as a target signal, a source signal that has been conveyed across an isolation boundary, the process comprising:

providing a puse transformer having a primary side to which the source signal is applied and having a secondary side from which the target signal is retrieved;

repetitively performing, in synchronization with a clocking signal, the following steps on the secondary side of the pulse transformer:

(1) driving a current pulse into the pulse transformer;

(2) sampling the voltage across the pulse transformer after it has stabilized but while the current pulse is still active; and (3) storing the sampled voltage for a full clock cycle; and performing the step on the primary side of the pulse transformer of clamping the voltage across the pulse transformer by the source signal during a portion of a clock cycle when the pulse transformer is being driven by the current pulse.

2. A process as in claim 1 wherein the steps repetitively performed on the secondary side of the pulse transformer further comprise the step of:

(4) filtering the sampled voltage.

3. A process for retrieving, as a target signal, a source signal that has been conveyed across an isolation boundary, the process comprising:

providing a pulse transformer having a primary side to which the source signal is applied and having a secondary side from which the target signal is retrieved;

repetitively performing, in synchronization with a clocking signal, the following steps on the secondary side of the pulse transformer:

(1) driving a current pulse into the pulse transformer;

(2) sampling the voltage across the pulse transformer after it has stabilized but while the current pulse is still active; and (3) detecting a reflected impedance as being high or low by quantitatively measuring the sampled voltage; and (4) setting a detector to a high or low voltage in correspondence with the detected impedance;

performing the step on the primary side of the pulse transformer of clamping the voltage across the pulse transformer by the source signal during a portion of a clock cycle when the pulse transformer is being driven by the current pulse.

4. A circuit for conveying a source signal across an isolation boundary and for retrieving the source signal as a target signal, the circuit comprising:

a pulse transformer having a primary winding and a secondary winding;

a PNP transistor having base, emitter, and collector terminals, the emitter and collector terminals being connected across the primary winding of said pulse transformer and the base and collector terminals being connected to receive said source signal;

a clamping diode connected across the secondary winding of said pulse transformer for clamping a voltage across the secondary winding and for providing a current path to allow said pulse transformer to reset;

clock means for providing a clocking signal;

a current source connected in series with said clamping diode and further connected to receive said clocking signal; and a sample and hold circuit having a pair of input terminals connected across said clamping diode, having a trigger input for receiving said clocking signal, and having a pair of output terminals across which said target signal is provided.

* * * * *